(12) United States Patent
Chen et al.

(10) Patent No.: US 9,837,228 B2
(45) Date of Patent: Dec. 5, 2017

(54) ILLUMINATED KEYBOARD WITH OPTICAL SWITCH

(71) Applicant: Primax Electronics Ltd., Neihu, Taipei (TW)

(72) Inventors: Chung-Yuan Chen, Taipei (TW); Wei-Ping Chan, Taipei (TW); Yi-Chen Wang, Taipei (TW)

(73) Assignee: Primax Electronics Ltd., Neihu, Taipei (*) Notice: Subject to any disclaimer, the term of this patent is extended or adjusted under 35 U.S.C. 154(b) by 101 days.

(21) Appl. No.: 15/137,297

(22) Filed: Apr. 25, 2016

(65) Prior Publication Data

US 2017/0117107 A1  Apr. 27, 2017

Related U.S. Application Data

(60) Provisional application No. 62/244,929, filed on Oct. 22, 2015.

(30) Foreign Application Priority Data

Mar. 11, 2016 (TW) .............................. 105107585 A

(51) Int. Cl.
*G06F 3/02* (2006.01)
*H01H 13/83* (2006.01)
*F21V 8/00* (2006.01)

(52) U.S. Cl.
CPC ........... *H01H 13/83* (2013.01); *G02B 6/0051* (2013.01); *G02B 6/0055* (2013.01); *G02B 6/0088* (2013.01); *H01H 2219/06* (2013.01); *H01H 2219/062* (2013.01)

(58) Field of Classification Search
CPC ...................................................... G06F 1/1662
USPC .................................................. 345/168, 170
See application file for complete search history.

(56) References Cited

U.S. PATENT DOCUMENTS

| | | | | |
|---|---|---|---|---|
| 6,369,800 B1* | 4/2002 | Nading | ................. | G06F 3/0202 200/314 |
| 7,855,715 B1* | 12/2010 | Bowen | ................. | G06F 3/0234 345/168 |
| 2016/0306437 A1* | 10/2016 | Zhang | ................. | G06F 3/0202 |

* cited by examiner

*Primary Examiner* — Roy Rabindranath
(74) *Attorney, Agent, or Firm* — Evan R. Witt; Kirton McConkie

(57) ABSTRACT

An illuminated keyboard with an optical switch is provided. The illuminated keyboard includes a circuit board and plural keys. The circuit board includes plural light-emitting elements. Each light-emitting element is aligned with the corresponding key. The key includes a keycap, a housing, a triggering post, a light guide element and a light guide frame. The keycap is located over the housing. The triggering post, the light guide element and the light guide frame are disposed within the housing. Moreover, the light guide frame is arranged around the triggering post. After a light beam emitted by the light-emitting element is introduced into the housing, the light beam is guided to the light guide frame by the light guide element, and the light beam is scattered to a region around the triggering post and outputted from the keycap.

27 Claims, 15 Drawing Sheets

ILLUMINATED KEYBOARD WITH OPTICAL SWITCH

FIELD OF THE INVENTION

The present invention relates to an illuminated keyboard, and more particularly to an illuminated keyboard with an optical switch.

BACKGROUND OF THE INVENTION

An illuminated keyboard is a keyboard with a lighting means to illuminate keys. FIG. 1 is a schematic exploded view illustrating a key of a conventional illuminated keyboard. The key 90 of the conventional illuminated keyboard comprises a circuit board 94, a light-emitting element 91, a key housing 92, a light-transmissible channel 921 and a keycap 93. The key housing 92 and the keycap 93 are located over the circuit board 94. The light-emitting element 91 is installed on the circuit board 94. For example, the light-emitting element 91 is a light emitting diode. Moreover, the light-transmissible channel 921 runs through the key housing 92. A light beam 911 emitted by the light-emitting element 91 passes through the key housing 92 via the light-transmissible channel 921. Moreover, a light guide structure 922 is formed in the light-transmissible channel 921 for assisting in guiding the light beam 911. Consequently, the light beam 911 is outputted from the keycap 93, and an illuminating function of the key 90 is achieved.

However, since the opening of the light-transmissible channel 921 of the conventional key 90 is very small, the light amount of the light beam 911 passing through the light-transmissible channel 921 is low. Moreover, since the light-outputting position of the light guide structure 922 is restricted by the opening of the light-transmissible channel 921, the light-outputting position of the light guide structure 922 is small. Consequently, only a small amount of the light beam is guided by the light guide structure 922, and the portion of the light beam that is guided to the outside of the light guide structure 922 is centralized to the periphery region around the opening of the light-transmissible channel 921. Under this circumstance, the light beam 911 cannot be uniformly diffused to the surroundings through the keycap 93, and thus the light beam cannot be effectively guided. Moreover, while the light beam passes through the inner portion of the key, a portion of the light beam is lost. Since a great amount of the light beam is wasted, the illuminating efficacy is impaired. Therefore, the conventional illuminated keyboard and its key need to be further improved.

SUMMARY OF THE INVENTION

An object of the present invention provides an illuminated keyboard with an optical switch.

For solving the drawbacks of the conventional technologies, the present invention provides an illuminated keyboard. A light guide element is disposed within the key. Moreover, the light guide element is in communication with a top side of the key. Consequently, the light beam is transferred from an inner portion of the key to the top side of the key and outputted to the surroundings through the top side of the key. Moreover, a reflective layer is formed on an inner wall of the key to reflect the light beam. Consequently, the light beam is not leaked out. Moreover, since the light beam can be uniformly outputted from the key to the surroundings through the light guide element, the light-collecting efficiency is increased and the illuminating efficacy is enhanced.

In accordance with an aspect of the present invention, there is provided an illuminated keyboard with an optical switch. The illuminated keyboard includes a circuit board and plural keys. The circuit board includes plural light-emitting elements, plural light emitters and plural light receivers. Each light-emitting element emits a light beam. Each light emitter emits a sensing light. Each light receiver generates an electronic signal when the sensing light from the corresponding light emitter is received by the light receiver. The plural keys are located over the circuit board. Each key is aligned with the corresponding light-emitting element, the corresponding light emitter and the corresponding light receiver. Each key includes a keycap, a housing, a first reflective element, a triggering post, a light guide element and a light guide frame. The housing is located under the keycap. The first reflective element is disposed within the housing. The sensing light is reflected by the first reflective element. The triggering post is connected with the keycap and inserted into housing. The triggering post is movable relative to the housing. A second reflective element is connected with the triggering post. After the sensing light from the first reflective element is received by the second reflective element, the sensing light is reflected to the light receiver by the second reflective element. The light guide element is disposed within the housing and located over the light-emitting element. The light guide frame is disposed within the housing. A top surface of the light guide frame is substantially at the same level with a top surface of the housing. The light guide frame is connected with the light guide element and arranged around the triggering post. After the light beam emitted by the light-emitting element is introduced into the housing, the light beam within the housing is guided to the light guide frame by the light guide element, and the light beam is scattered to a region around the triggering post and outputted from the keycap. After the sensing light emitted by the light emitter is introduced into the housing and reflected to the second reflective element by the first reflective element, the sensing light is reflected to the light receiver by the second reflective element, so that the light receiver generates the electronic signal.

In an embodiment, an entrance runs through the top surface of the housing, and the triggering post is inserted into the housing through the entrance. The light guide frame is arranged around the triggering post and accommodated within the entrance.

In an embodiment, the first reflective element is aligned with the light emitter, and the second reflective element is aligned with the light receiver.

In an embodiment, the second reflective element is connected with a bottom surface of the triggering post, and the second reflective element is moved with the triggering post.

In an embodiment, the housing includes a first perforation and a second perforation. The first perforation is aligned with the light emitter, and the sensing light is introduced into the housing through the first perforation. The second perforation is aligned with the light receiver, and the sensing light is outputted from the housing through the second perforation.

In an embodiment, the housing further includes a filter, and the filter is disposed on a bottom surface of the housing and aligned with the second perforation.

In an embodiment, the housing further includes a light-inputting opening, and the light-inputting opening is aligned with the light guide element and located over the light-emitting element. The light beam outside the housing is introduced into the light guide element through the light-inputting opening.

In an embodiment, the housing further includes a reflective layer, and the reflective layer is formed on an inner wall of the housing for reflecting the light beam within the housing.

In an embodiment, a reflective space is defined between the light guide element and the reflective layer of the housing.

In an embodiment, the light guide frame and a top of the light guide element are integrated with each other.

In an embodiment, the light guide element is a light guide post.

In an embodiment, the light guide element is a light guide wall that is extended from a sidewall of the light guide frame toward the light-emitting element.

In an embodiment, the light guide wall has a light guide structure, and the light guide structure is formed on a surface of the light guide wall for guiding the light beam to the light guide frame.

In an embodiment, the light guide element and the light guide frame are made of a light-guiding material.

In accordance with another aspect of the present invention, there is provided an illuminated keyboard with an optical switch. The illuminated keyboard includes a circuit board and plural keys. The circuit board includes plural light-emitting elements, plural light emitters and plural light receivers. Each light-emitting element emits a light beam. Each light emitter emits a sensing light. Each light receiver generates an electronic signal when the sensing light from the corresponding light emitter is received by the light receiver. The plural keys are located over the circuit board. Each key is aligned with the corresponding light-emitting element, the corresponding light emitter and the corresponding light receiver. Each key includes a keycap, a housing, a light guide element, a first reflective element and a triggering post. The housing is located under the keycap. The light guide element is disposed within the housing and located over the light-emitting element. The first reflective element is disposed within the housing. The sensing light is reflected by the first reflective element. The triggering post is connected with the keycap and inserted into housing. The triggering post is contacted with the light guide element. A second reflective element is connected with the triggering post. After the sensing light from the first reflective element is received by the second reflective element, the sensing light is reflected to the light receiver by the second reflective element. The triggering post is made of a light-guiding material. The triggering post is movable relative to the light guide element. While the triggering post is moved, the triggering post is continuously contacted with the light guide element. After the light beam emitted by the light-emitting element is introduced into the housing, the light beam within the housing is guided to the triggering post by the light guide element, and the light beam is transmitted through the triggering post and outputted from the keycap. After the sensing light emitted by the light emitter is introduced into the housing and reflected to the second reflective element by the first reflective element, the sensing light is reflected to the light receiver by the second reflective element, so that the light receiver generates the electronic signal.

In an embodiment, the first reflective element is aligned with the light emitter, and the second reflective element is aligned with the light receiver.

In an embodiment, the second reflective element is connected with a bottom surface of the triggering post, and the second reflective element is moved with the triggering post.

In an embodiment, the housing includes a first perforation and a second perforation. The first perforation is aligned with the light emitter, and the sensing light is introduced into the housing through the first perforation. The second perforation is aligned with the light receiver. The sensing light is outputted from the housing through the second perforation.

In an embodiment, the housing further includes a filter, and the filter is disposed on a bottom surface of the housing and aligned with the second perforation.

In an embodiment, the housing includes an entrance, and the triggering post includes a first contact surface. The triggering post is inserted into the housing through the entrance, and the first contact surface is contacted with the light guide element.

In an embodiment, the light guide element further includes a second contact surface. The first contact surface is contacted with the second contact surface and movable relative to the second contact surface.

In an embodiment, after the light beam is transferred to the second contact surface through the light guide element, the light beam is introduced into the triggering post through the second contact surface and the first contact surface.

In an embodiment, while the triggering post is moved, the first contact surface and second contact surface are continuously contacted with each other, so that the light beam is continuously introduced into the triggering post.

In an embodiment, the first contact surface and second contact surface are disposed within the housing.

In an embodiment, the housing further includes a light-inputting opening, and the light-inputting opening is aligned with the light guide element and located over the light-emitting element. The light beam outside the housing is introduced into the light guide element through the light-inputting opening.

In an embodiment, the housing further includes a reflective layer, and the reflective layer is formed on an inner wall of the housing for reflecting the light beam within the housing.

In an embodiment, a reflective space is defined between the light guide element and the reflective layer of the housing.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments and accompanying drawings.

Figure 1:
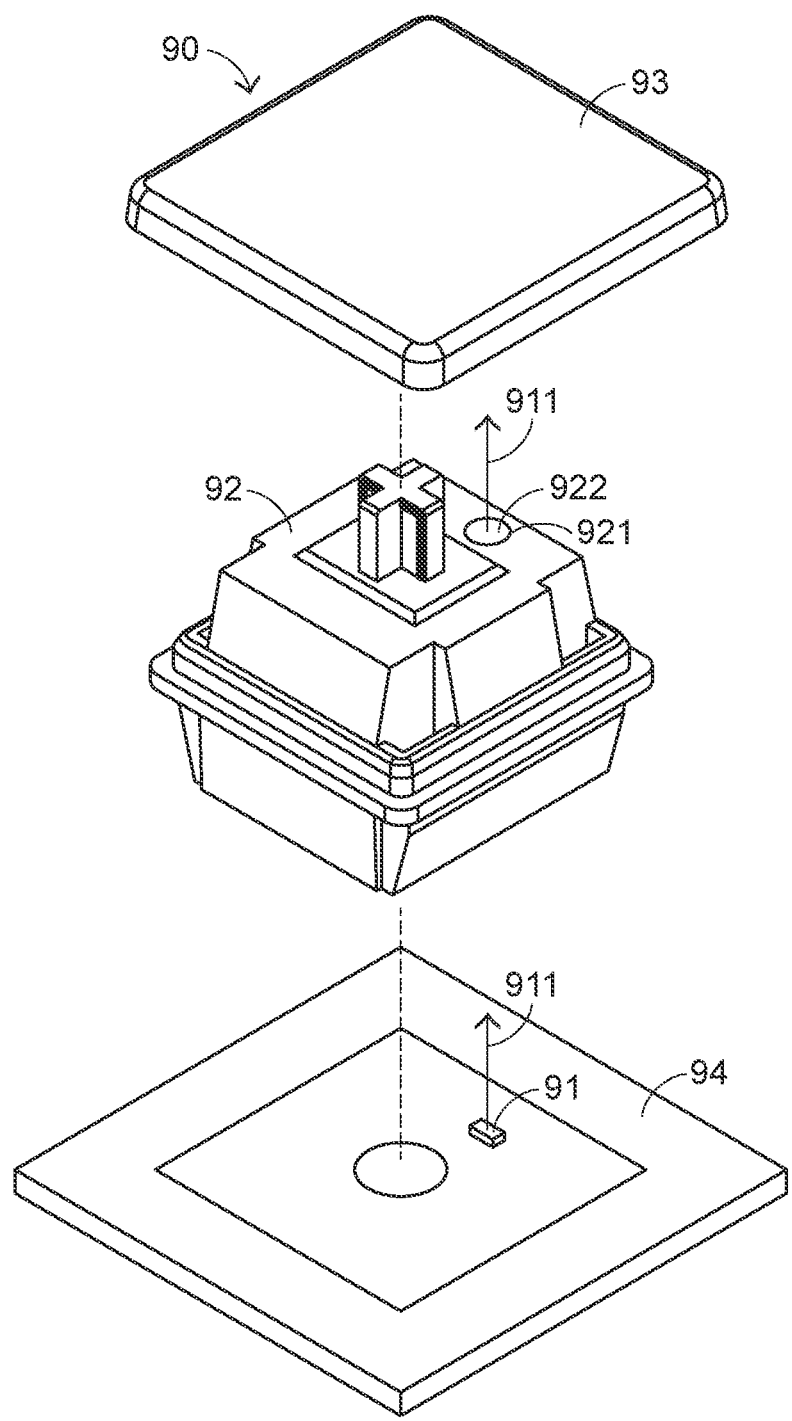
FIG. 1 is a schematic exploded view illustrating a key of a conventional illuminated keyboard.
Figure 2:
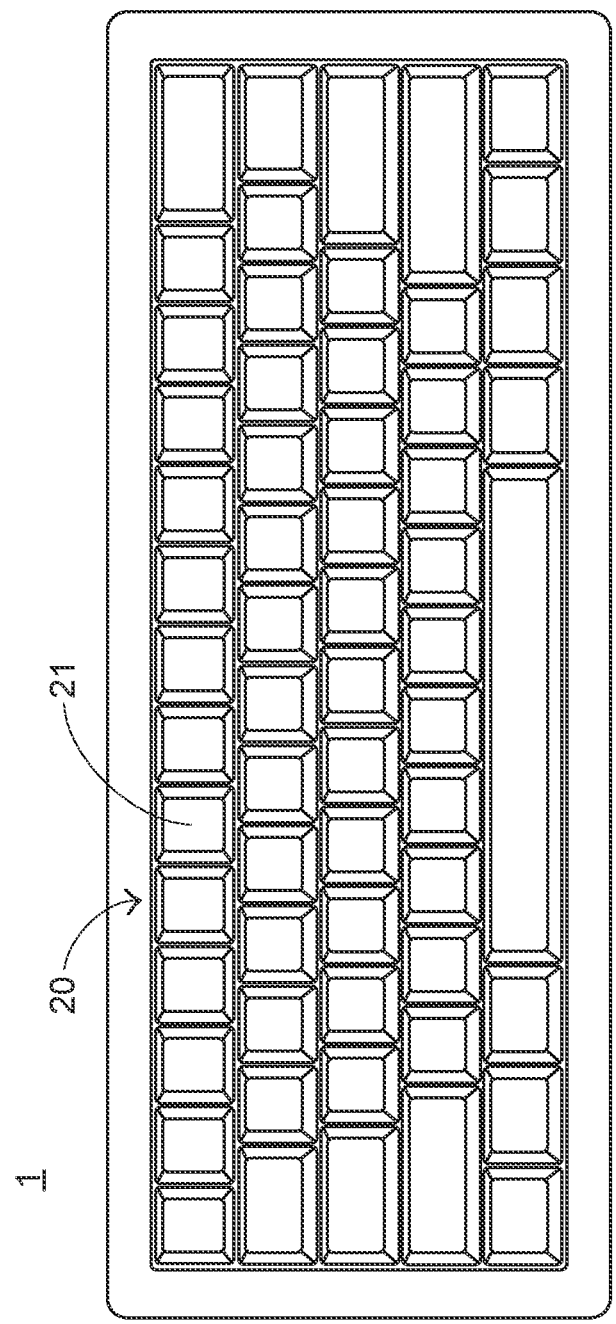
FIG. 2 is a schematic top view illustrating a keyboard according to a first embodiment of the present invention.
Figure 3:
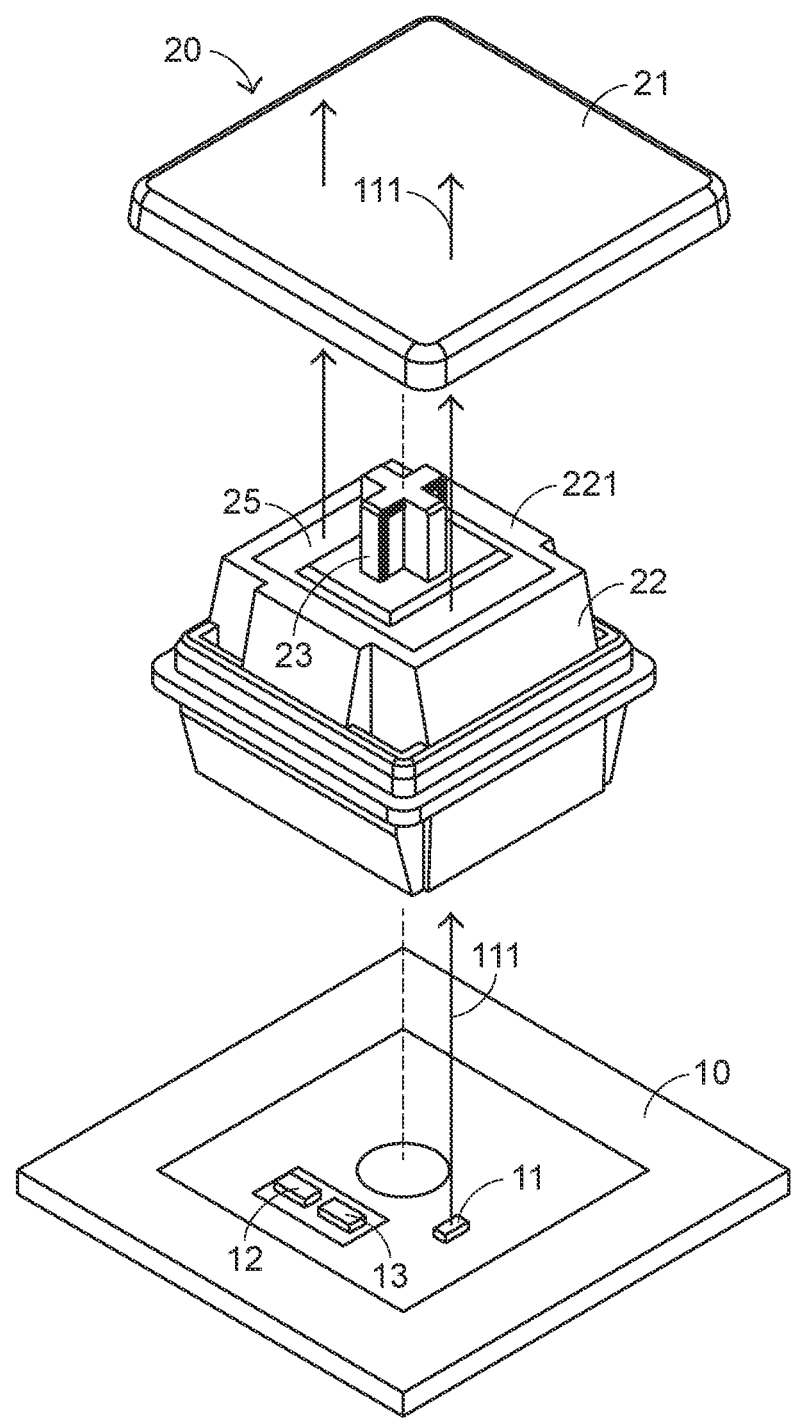
FIG. 3 is a schematic exploded view illustrating a portion of the keyboard according to the first embodiment of the present invention.

FIG. 2 is a schematic top view illustrating a keyboard according to a first embodiment of the present invention. FIG. 3 is a schematic exploded view illustrating a portion of the keyboard according to the first embodiment of the present invention.

The illuminated keyboard 1 comprises a circuit board 10 and plural keys 20. Moreover, plural light-emitting elements 11, plural light emitters 12 and plural light receivers 13 are disposed on the circuit board 10. The plural keys 20 are located over the circuit board 10. Moreover, each key 20 is aligned with a corresponding light-emitting element 11, a corresponding light emitter 12 and a corresponding light receiver 13. In this embodiment, each key 20 comprises a keycap 21, a housing 22, a triggering post 23, a light guide element 24 (see FIG. 6), a light guide frame 25, a first reflective element 26 (see FIG. 5) and a second reflective element 27 (see FIG. 5).

The structure of one key 20 will be illustrated in more details as follows. The keycap 21 of the key 20 is located over the circuit board 10. Preferably, the keycap 21 is made of a light-transmissible material. The housing 22 is located under the keycap 21 and aligned with the corresponding light-emitting element 11. The triggering post 23 is connected with the keycap 21 and inserted into the inner portion of housing 22. Moreover, the triggering post 23 is movable relative to the housing 22. The light guide element 24 (see FIG. 6) is disposed within the housing 22 and located over the light-emitting element 11. The light guide frame 25 is disposed within the housing 22, and a top surface of the light guide frame 25 is substantially at the same level with a top surface 221 of the housing 22. Moreover, the light guide frame 25 is connected with the light guide element 24 (see FIG. 6) and arranged around the triggering post 23. The light emitter 12 and the light receiver 13 are located under the housing 22. Moreover, the light emitter 12 and the light receiver 13 are disposed on the circuit board 10 and located adjacent to each other. The key 20 of the present invention has two functions. The first function is an illuminating function. The second function is to generate an electronic signal of a key switch. According to the two functions, the inner components of the key 20 may be classified into two groups. Firstly, the components of generating the electronic signal of the key switch will be illustrated as follows. The light emitter 12 emits a sensing light X (see FIG. 5). The first reflective element 26 (see FIG. 5) and the second reflective element 27 (see FIG. 5) are disposed within the housing 22 for reflecting the sensing light X (see FIG. 5) to the light receiver 13. When the sensing light X (see FIG. 5) is received by the light receiver 13, an electronic signal 131 (see FIG. 5) is generated. Next, the components of achieving the illuminating function will be illustrated as follows. After a light beam 111 generated by the light-emitting element 11 is introduced into the inner portion of the housing 22, the light beam 111 within the housing 22 is guided to the light guide frame 25 by the light guide element 24. Consequently, the light beam 111 is scattered to the region around the triggering post 23 and outputted to the surroundings through the keycap 21. Under this circumstance, the illuminating function of the key 20 is achieved.

Figure 4:
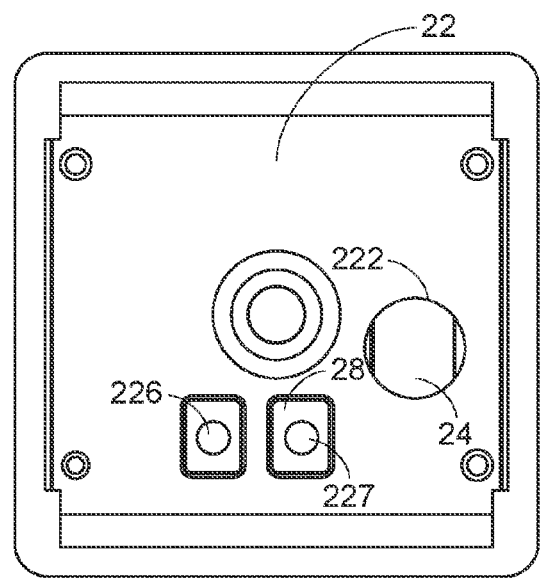
FIG. 4 is a schematic bottom view illustrating the housing of the key according to the first embodiment of the present invention.

The components will be continuously described in more details as follows. FIG. 4 is a schematic bottom view illustrating the housing of the key according to the first embodiment of the present invention. As shown in FIG. 4, the housing 22 comprises a light-inputting opening 222, a first perforation 226, a second perforation 227 and a filter 28. The light-inputting opening 222, the first perforation 226, the second perforation 227 and the filter 28 are located at a bottom of the housing 22. The light-inputting opening 222 is associated with the illuminating function. The first perforation 226, the second perforation 227 and the filter 28 are associated with the function of generating the electronic signal of the key switch. The light-inputting opening 222 is aligned with the light guide element 24 and located over the light-emitting element 11. After the light beam 111 passes through the light-inputting opening 222, the light beam 111 is introduced into the light guide element 24 that is disposed within the housing 22. The first perforation 226 is aligned with the light emitter 12 and located under the first reflective element 26. Consequently, the sensing light X (see FIG. 5) is introduced into the housing 22 through the first perforation 226. The second perforation 227 is aligned with the light receiver 13 and located under the second reflective element 27. Consequently, the sensing light X (see FIG. 5) is outputted from the housing 22 through the second perforation 227. The filter 28 is disposed on a bottom surface of the housing 22 and aligned with the second perforation 227. The filter 28 is used for filtering off the stray light contained in the sensing light X (see FIG. 5).

Figure 5:
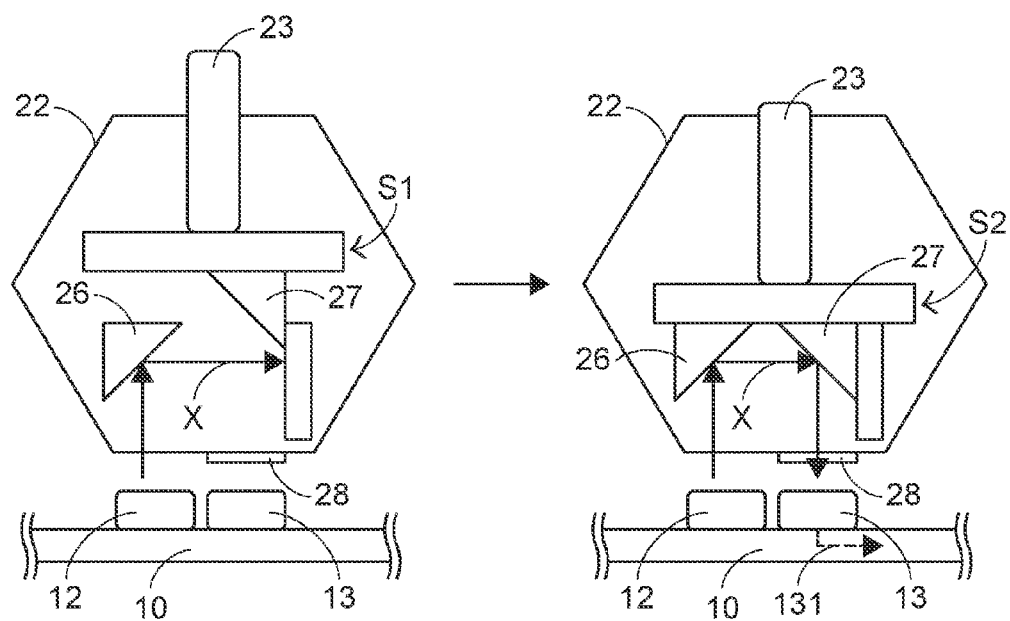
FIG. 5 schematically illustrates the action of generating the electronic signal of the key switch according to the first embodiment of the present invention.

A process of operating the key 20 to generate the electronic signal of the key switch will be illustrated in more details as follows. FIG. 5 schematically illustrates the action of generating the electronic signal of the key switch according to the first embodiment of the present invention. As shown in FIG. 5, the second reflective element 27 is connected with a bottom surface of the triggering post 23. Moreover, the second reflective element 27 is moved with the triggering post 23. When the key 20 is not depressed, the triggering post 23 is in a first position S1 because the triggering post 23 is not depressed. Meanwhile, the sensing light X from the light emitter 12 on the circuit board 10 is introduced into the housing 22 through the first perforation 226 and reflected by the first reflective element 26. Since the triggering post 23 is in the first position S1, the sensing light X from the first reflective element 26 cannot be received by the second reflective element 27. Consequently, the electronic signal 131 is not generated. When the key 20 is depressed, the triggering post 23 is moved to a second position S2 because the triggering post 23 is depressed. Meanwhile, the sensing light X from the first reflective element 26 can be received by the second reflective element 27. Moreover, the sensing light X is reflected to the outside of the housing 22 through the second perforation 227 by the second reflective element 27 and directed to the light receiver 13. After the sensing signal X is received by the light receiver 13, the electronic signal 131 is generated. Moreover, if the sensing light X is interfered by the surrounding stray light, the light receiver 13 may erroneously receive the sensing light X or misjudge the sensing light X. For avoiding this problem, the sensing light X is transmitted through the filter 28 after the sensing light X is outputted from the housing 22. The surrounding stray light that possibly interferes with the sensing light X is filtered off by the filter 28. Then, the filtered sensing light X is irradiated to the light receiver 13, and thus the light receiver 13 generates the electronic signal 131.

Preferably, the light emitter 12 is an infrared light source, the sensing light X is an infrared light, the light receiver 13 is an infrared light receiver, and the filter 28 is an infrared filter.

Figure 6:
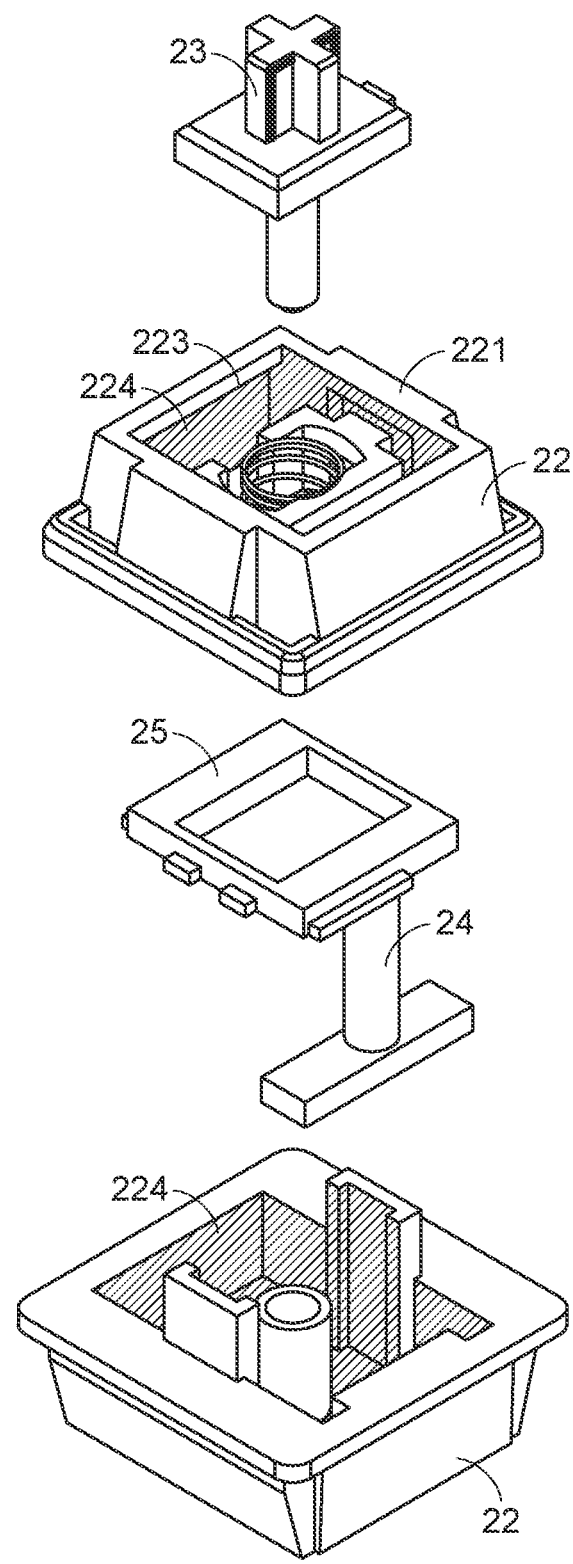
FIG. 6 is a schematic exploded view illustrating a key of the keyboard according to the first embodiment of the present invention.

An illuminating process of the key 20 will be illustrated in more details as follows. FIG. 6 is a schematic exploded view illustrating a key of the keyboard according to the first embodiment of the present invention. As shown in FIG. 6, the housing 22 further comprises an entrance 223 and a reflective layer 224. The light-inputting opening 222 runs through the bottom surface of the housing 22. Moreover, the light-inputting opening 222 is aligned with the light guide element 24 and located over the light-emitting element 11. After the light beam 111 passes through the light-inputting opening 222, the light beam 111 is introduced into the reflective layer 224 within the housing 22. The entrance 223 runs through the top surface 221 of the housing 22. The triggering post 23 is inserted into the housing 22 through the entrance 223. The light guide frame 25 is arranged around the triggering post 23 and accommodated within the entrance 223. The reflective layer 224 is formed on an inner wall of the housing 22 for reflecting the light beam 111 within the housing 22.

Figure 7:
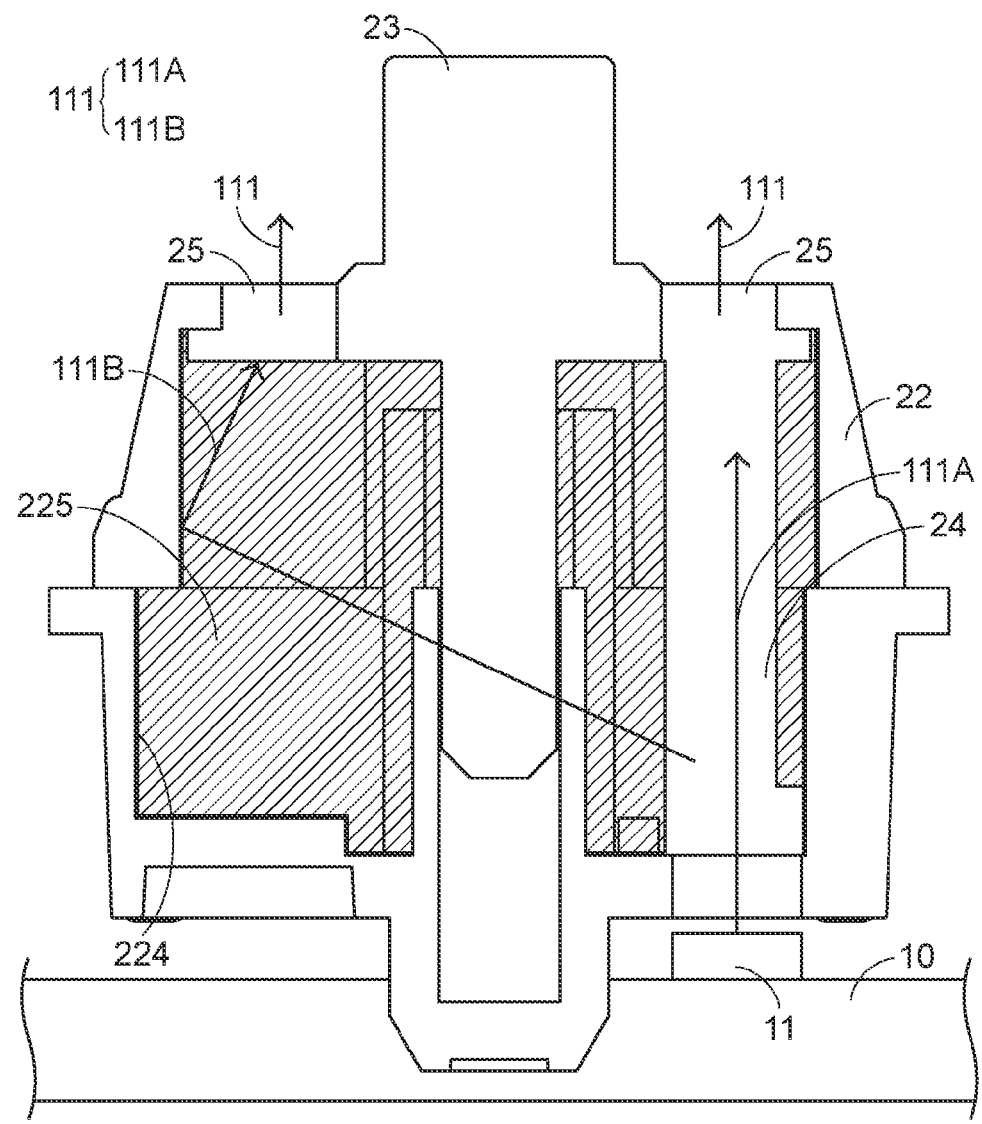
FIG. 7 is a schematic cross-sectional view illustrating the optical path of guiding the light beam through a key of the keyboard according to the first embodiment of the present invention.

FIG. 7 is a schematic cross-sectional view illustrating the optical path of guiding the light beam through a key of the keyboard according to the first embodiment of the present invention. During the process of transferring the light beam 111, the light beam 111 is possibly leaked from the light guide element 24 to the inner portion of the housing 22. Under this circumstance, the efficacy of guiding the light beam is impaired. For increasing the light-guiding efficacy, a reflective space 225 is defined by the reflective layer 224 within the housing 22. Particularly, the light beam 111 emitted by the light-emitting element 11 on the circuit board 11 is upwardly introduced into the light guide element 24 within the housing 22. After the light beam 111 is introduced into the light guide element 24, a first portion 111A of the light beam 111 is directly transferred to the light guide frame 25 through the light guide element 24, and a second portion 111B of the light beam 111 is leaked from the light guide element 24 to the reflective space 225. After the second portion 111B of the light beam 111 is leaked to the reflective space 225, the second portion 111B of the light beam 111 is reflected to the light guide frame 25 by the reflective layer 224. Since the second portion 111B of the light beam 111 leaked to the reflective space 225 is reflected to the light guide frame 25, the light-collecting efficiency is enhanced. Moreover, the light beam 111 can be guided to the region under the keycap 21 and uniformly diffused to the top of the key so as to be outputted from the keycap 21.

In this embodiment, the light guide element 24 is a light guide post, and the light guide frame 25 and the light guide element 24 are integrated with each other. Moreover, the light guide element 24 and the light guide frame 25 are made of a light-guiding material.

Figure 8:
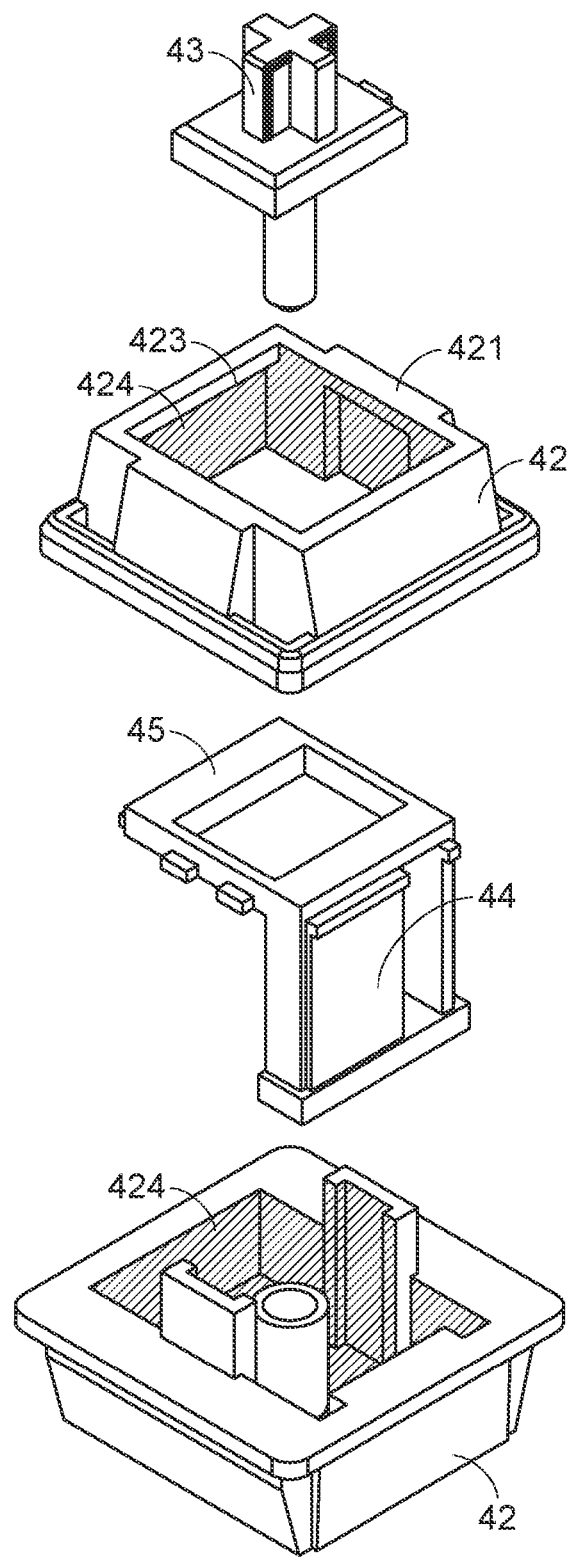
FIG. 8 is a schematic exploded view illustrating a key of a keyboard according to a second embodiment of the present invention.
Figure 9:
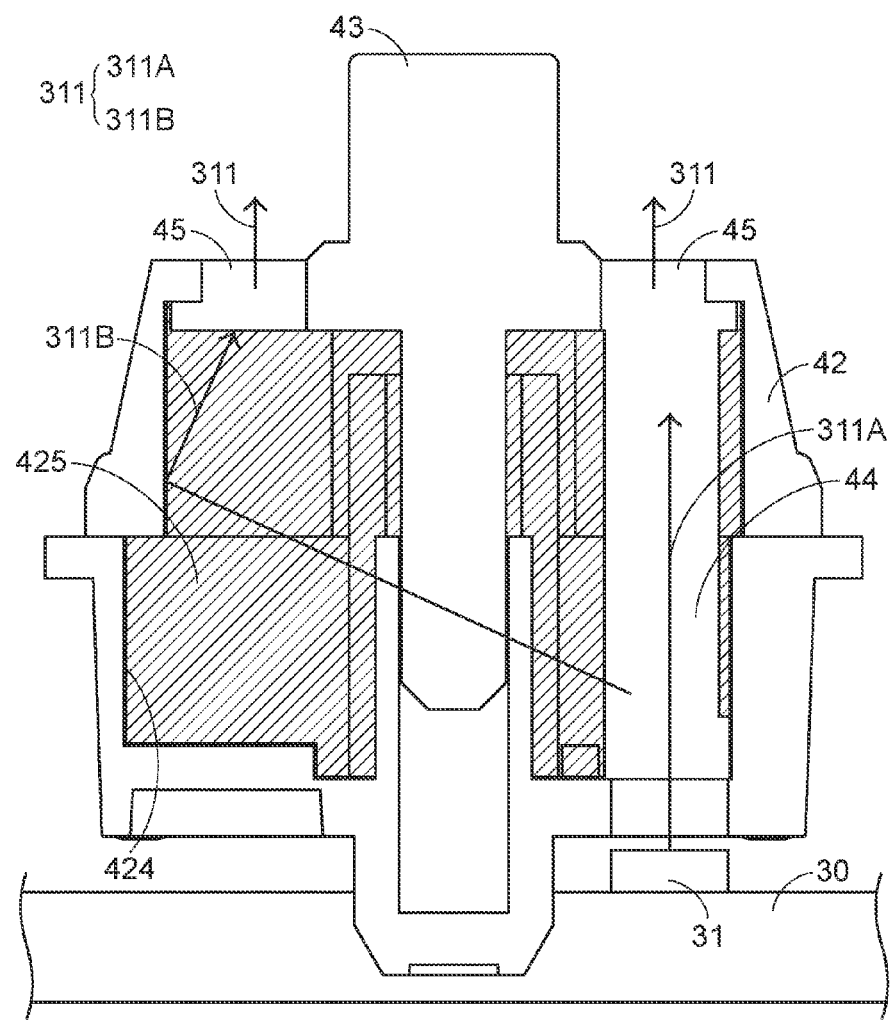
FIG. 9 is a schematic cross-sectional view illustrating the optical path of guiding the light beam through a key of the keyboard according to the second embodiment of the present invention.

Hereinafter, a keyboard according to a second embodiment will be illustrated with reference to FIGS. 8 and 9. FIG. 8 is a schematic exploded view illustrating a key of a keyboard according to a second embodiment of the present invention. FIG. 9 is a schematic cross-sectional view illustrating the optical path of guiding the light beam through a key of the keyboard according to the second embodiment of the present invention. In this embodiment, the components and the process of generating the electronic signal of the key switch that are similar to the first embodiment are not redundantly described herein. The keyboard comprises a circuit board 30, a light-emitting element 31, a housing 42, a triggering post 43, a light guide element 44 and a light guide frame 45. An entrance 423 runs through a top surface 421 of the housing 42. A reflective layer 424 is formed on an inner wall of the housing 42. A reflective space 425 is defined by the reflective layer 424 within the housing 42. The housing 42 is located over the circuit board 30 and aligned with the light-emitting element 31. The triggering post 43 is inserted into the housing 42 through the entrance 423. The light guide frame 45 is arranged around the triggering post 43 and accommodated within the entrance 423. The light guide element 44 is connected with the light guide frame 45 and disposed within the housing 42. For increasing the light-guiding efficacy of the light guide element 44, the light guide element 44 is a light guide wall that is extended from a sidewall of the light guide frame 45 toward the light-emitting element 31. Since the light-guiding volume of the light guide element 44 is increased, the light-guiding efficacy is enhanced.

The process of guiding the light beam according to the second embodiment is shown in FIG. 9. The light beam 311 emitted by the light-emitting element 31 is introduced into the light guide element 44 within the housing 42. The light beam 311 contains a first portion 311A and a second portion 311B. The first portion 311A of the light beam 311 is transferred to the light guide frame 35 through the light guide element 44. Since the volume of the light guide element 44 is increased, a greater fraction of the first portion 311A of the light beam 311 can be guided to the light guide frame 35 through the light guide element 44. After the second portion 311B of the light beam 311 is leaked from the light guide element 44 to the reflective space 425, the second portion 311B of the light beam 311 is reflected to the light guide frame 45 by the reflective layer 424. Then, the second portion 311B is mixed with the first portion 311A to produce the light beam 311 again. Consequently, the light beam 311 is scattered to the region around the triggering post 43.

Figure 10:
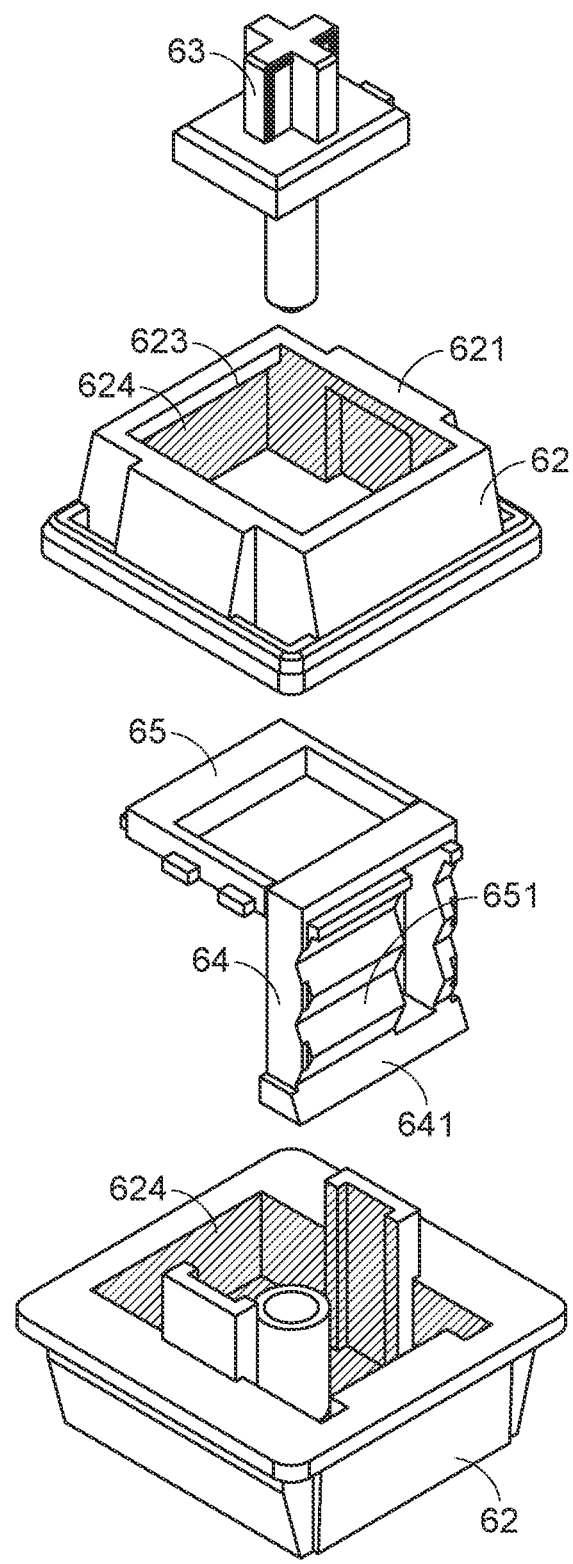
FIG. 10 is a schematic exploded view illustrating a key of a keyboard according to a third embodiment of the present invention.
Figure 11:
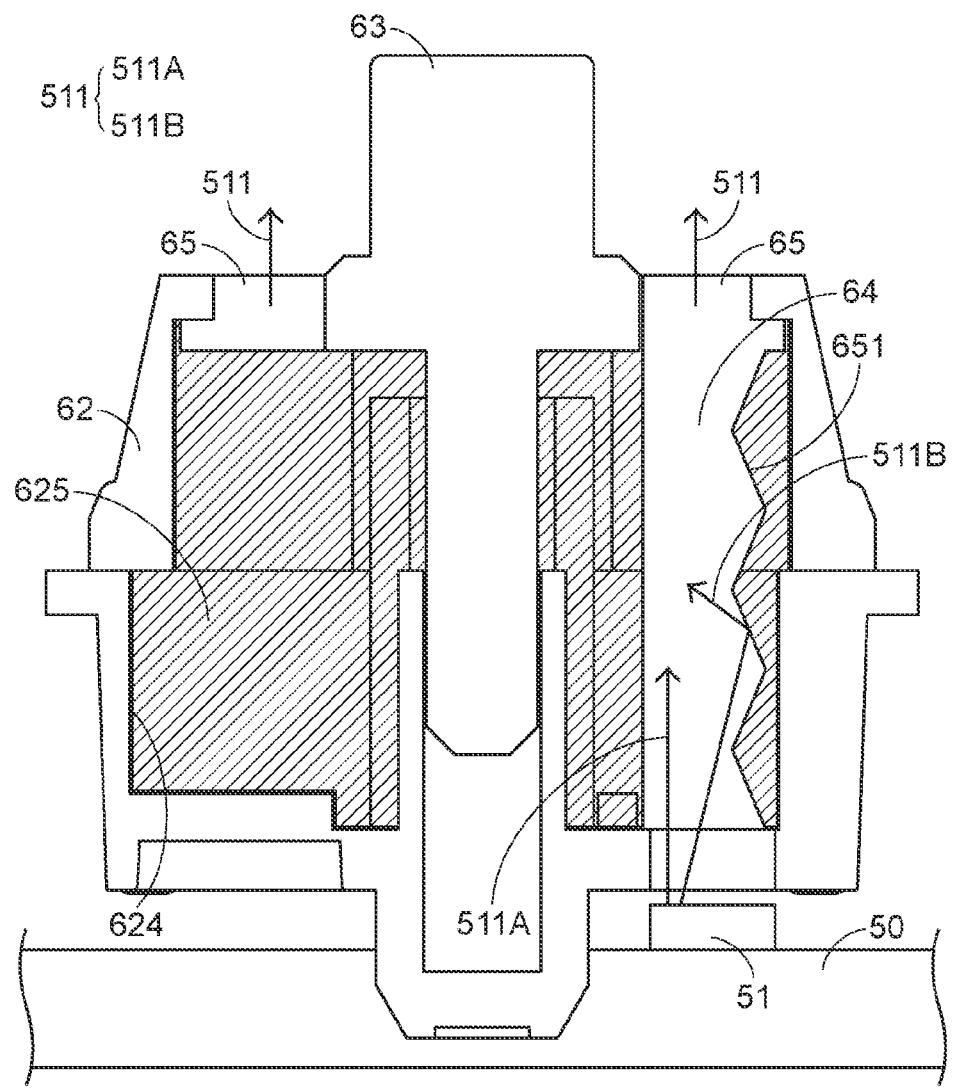
FIG. 11 is a schematic cross-sectional view illustrating the optical path of guiding the light beam through a key of the keyboard according to the third embodiment of the present invention.

Hereinafter, a keyboard according to a third embodiment will be illustrated with reference to FIGS. 10 and 11. FIG. 10 is a schematic exploded view illustrating a key of a keyboard according to a third embodiment of the present invention. FIG. 11 is a schematic cross-sectional view illustrating the optical path of guiding the light beam through a key of the keyboard according to the third embodiment of the present invention. In this embodiment, the components and the process of generating the electronic signal of the key switch that are similar to the second embodiment are not redundantly described herein. The keyboard comprises a circuit board 50, a light-emitting element 51, a housing 62, a triggering post 63, a light guide element 64 and a light guide frame 65. An entrance 623 runs through a top surface 621 of the housing 62. A reflective layer 624 is formed on an inner wall of the housing 62. A reflective space 625 is defined by the reflective layer 624 within the housing 62. For increasing the light-guiding efficacy of the light guide element 64, the light guide element 64 is a light guide wall, and a light guide structure 651 is formed on a surface 641 of the light guide wall. The housing 62 is located over the circuit board 50 and aligned with the light-emitting element 51. The triggering post 63 is inserted into the housing 62 through the entrance 623. The light guide frame 65 is arranged around the triggering post 63 and accommodated within the entrance 623. The light guide element 64 is connected with the light guide frame 65 and disposed within the housing 62.

The process of guiding the light beam according to the third embodiment is shown in FIG. 11. The light beam 511 emitted by the light-emitting element 51 is introduced into the light guide element 64 within the housing 62. The light beam 511 contains a first portion 511A and a second portion 511B. The first portion 511A of the light beam 511 is transferred to the light guide frame 65 through the light guide element 64. Since the volume of the light guide element 64 is increased, a greater fraction of the first portion 511A of the light beam 511 can be guided to the light guide frame 65 through the light guide element 64. Similarly, the second portion 511B of the light beam 511 is leaked from the light guide element 54. However, because of the light guide structure 651, a part of the second portion 511B of the light beam 511 is reflected back to the light guide element 64. In other words, less amount of the second portion 511B of the light beam 511 is leaked from the light guide element 64 to the housing 62. Then, the second portion 511B reflected back to the light guide element 64 is mixed with the first portion 511A to produce the light beam 511 again. The light beam 511 is transferred to the light guide frame 65 and scattered to the region around the triggering post 63. Similarly, the housing 62 also comprises the reflective layer 624 and the reflective space 625. After the second portion 511B of the light beam 511 is leaked to the reflective space 625, the second portion 511B of the light beam 511 is reflected to the light guide frame 65 by the reflective layer 624.

Figure 12:
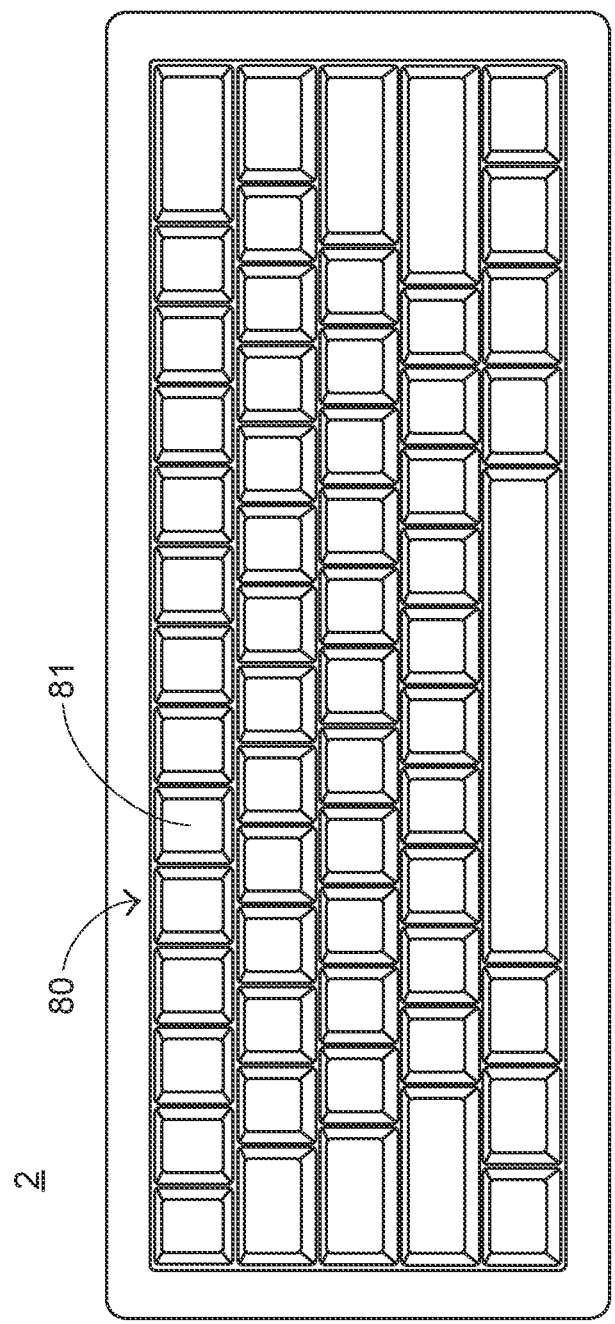
FIG. 12 is a schematic top view illustrating a keyboard according to a fourth embodiment of the present invention.
Figure 13:
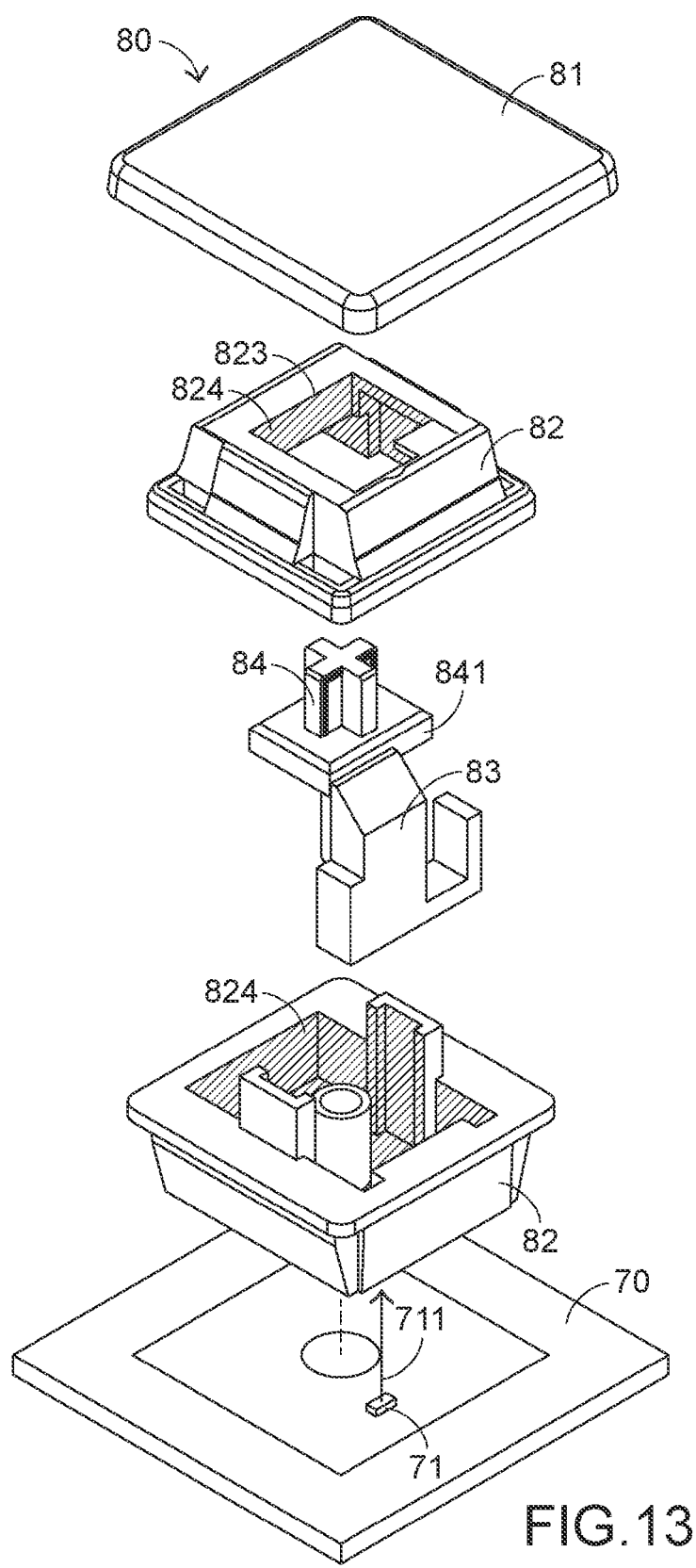
FIG. 13 is a schematic exploded view illustrating a key of the keyboard according to the fourth embodiment of the present invention.
Figure 14:
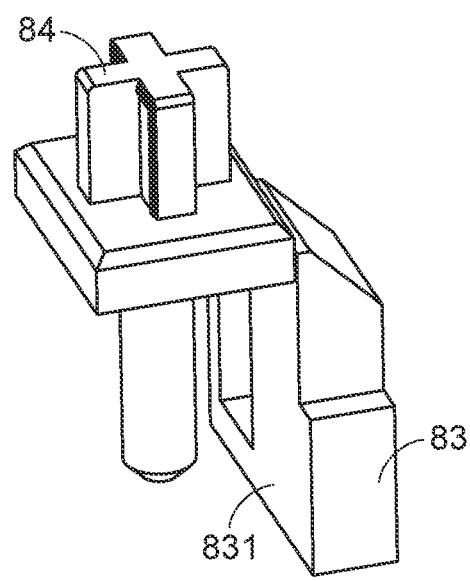
FIG. 14 is a schematic perspective view illustrating a light guide element and a triggering post of the keyboard according to the fourth embodiment of the present invention.

Hereinafter, a keyboard according to a fourth embodiment will be illustrated with reference to FIGS. 12, 13 and 14. FIG. 12 is a schematic top view illustrating a keyboard according to a fourth embodiment of the present invention. FIG. 13 is a schematic exploded view illustrating a key of the keyboard according to the fourth embodiment of the present invention. FIG. 14 is a schematic perspective view illustrating a light guide element and a triggering post of the keyboard according to the fourth embodiment of the present invention.

The components and the process of generating the electronic signal of the key switch that are similar to the first embodiment are not redundantly described herein. The illuminated keyboard 2 comprises a circuit board 70 and plural keys 80. Moreover, plural light-emitting elements 71 are disposed on the circuit board 70. Moreover, each key 80 is aligned with a corresponding light-emitting element 71. Each key 20 comprises a keycap 81, a housing 82, a light guide element 83 and a triggering post 84.

The structure of one key 80 will be illustrated in more details as follows. The keycap 81 of the key 80 is located over the circuit board 70. The housing 82 is located under the keycap 81 and aligned with the corresponding light-emitting element 71. The light guide element 83 is disposed within the housing 82 and located over the light-emitting element 71. The triggering post 84 is connected with the keycap 81 and inserted into the inner portion of housing 82. Moreover, the triggering post 84 is contacted with the light guide element 83. The triggering post 84 is made of a light-guiding material. In addition, the triggering post 84 is movable relative to the light guide element 83. While the triggering post 84 is moved, the triggering post 84 is continuously contacted with the light guide element 83. After a light beam 711 generated by the light-emitting element 71 is introduced into the inner portion of the housing 82 and the light guide element 83, the light beam 711 is guided to the triggering post 84 by the light guide element 83. Consequently, the light beam 711 is transmitted through the triggering post 84 and outputted to the surroundings through the keycap 81.

Please refer to FIGS. 13 and 14 again. The housing 82 further comprises an entrance 841 and a light-inputting opening (not shown). The function of the light-inputting opening is similar to that of the first embodiment, and is not redundantly described herein. In this embodiment, the triggering post 84 further comprises a first contact surface 841, and the light guide element 83 further comprises a second contact surface 831. The first contact surface 841 and the second contact surface 831 are both disposed within the housing 82. The triggering post 84 is inserted into the housing 82 through the entrance 841. The first contact surface 841 of the triggering post 84 and the second contact surface 831 of the light guide element 83 are contacted with each other. Moreover, the first contact surface 841 is moved relative to the second contact surface 831. While the triggering post 84 is moved, the first contact surface 841 and the second contact surface 831 are continuously contacted with each other. Consequently, the light beam 711 is continuously guided to the triggering post 84 through the light guide element 83.

Figure 15:
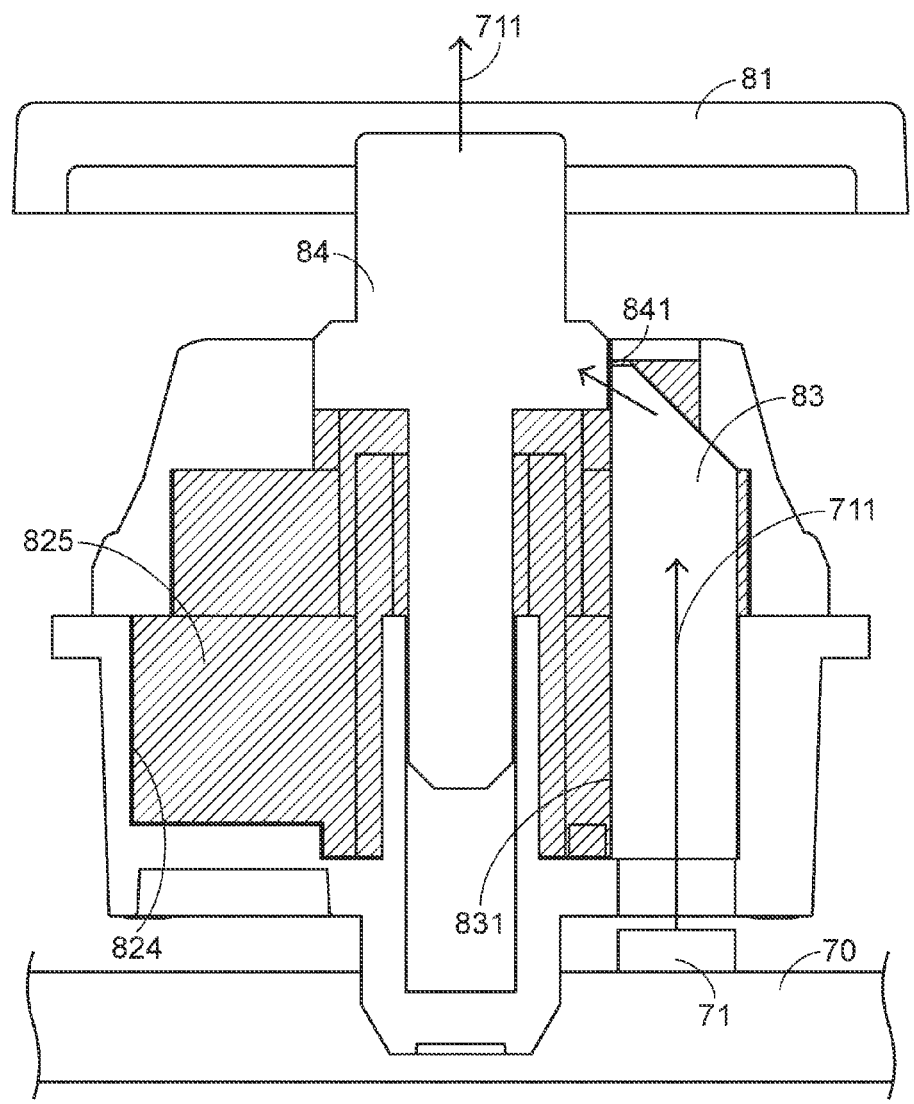
FIG. 15 is a schematic cross-sectional view illustrating the optical path of guiding the light beam through an undepressed key of the keyboard according to the fourth embodiment of the present invention.
Figure 16:
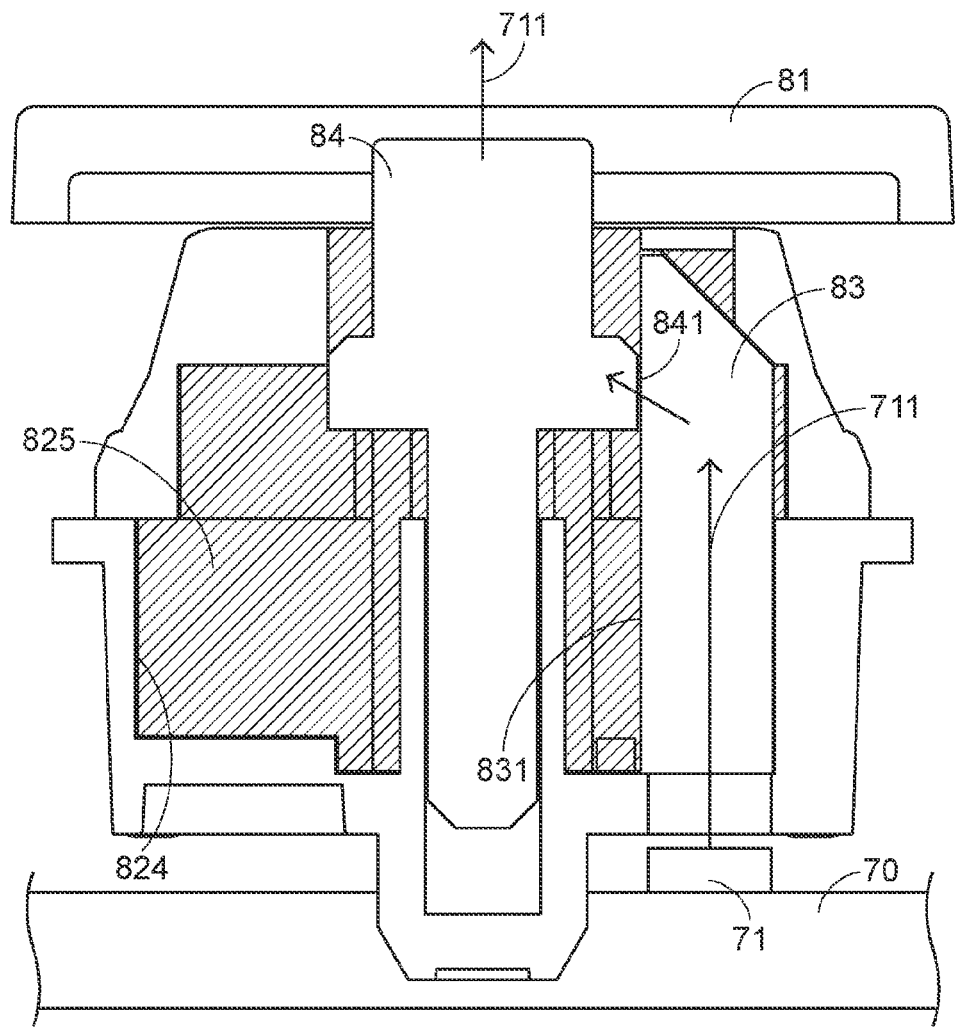
FIG. 16 is a schematic cross-sectional view illustrating the optical path of guiding the light beam through a depressed key of the keyboard according to the fourth embodiment of the present invention.

The process of guiding the light beam according to the fourth embodiment will be illustrated with reference to FIGS. 15 and 16. FIG. 15 is a schematic cross-sectional view illustrating the optical path of guiding the light beam through an undepressed key of the keyboard according to the fourth embodiment of the present invention. FIG. 16 is a schematic cross-sectional view illustrating the optical path of guiding the light beam through a depressed key of the keyboard according to the fourth embodiment of the present invention. As shown in FIG. 15, the key 80 is not depressed (i.e., in an ordinary mode). The light beam 711 emitted by the light-emitting element 71 is introduced into the light guide element 83 within the housing 82. The light beam 711 is transferred to the second contact surface 831 by the light guide element 83. After the light beam 711 is outputted from the second contact surface 831, the light beam 711 is introduced into the triggering post 84 through the first contact surface 841. Then, the light beam 711 is transferred from the triggering post 84 to the keycap 81. After the light beam 711 is outputted from the keycap 81, the illuminating function of the key 80 is achieved. As shown in FIG. 16, the key 80 is depressed. As the triggering post 84 is moved downwardly, the first contact surface 841 is continuously contacted with the second contact surface 831. Consequently, the light beam 711 is continuously transferred from the light guide element 83 to the triggering post 84, and the light beam 711 is continuously transferred to the keycap 81.

During the process of transferring the light beam 711, the light beam 711 is possibly leaked to the inner portion of the housing 82. For increasing the light-guiding efficacy, the housing 82 further comprises a reflective layer 824, and a reflective space 825 is defined by the reflective layer 824. The structures of the reflective layer 824 and the reflective space 825 and the process of reflecting the light beam 711 are similar to those of the first embodiment, and are not redundantly described herein.

From the above descriptions, the present invention provides the illuminated keyboard. After the light beam is guided to the triggering post, the light beam is scattered to the region around the triggering post and outputted from the keycap through the triggering post. Since the light beam is centralized to the middle region of the keycap, the light-guiding efficacy is enhanced. Moreover, since the reflective layer is formed on the inner wall of the casing, the light beam is not leaked out. In other words, the use of the illuminated keyboard of the present invention can overcome the drawbacks of the conventional technologies.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. An illuminated keyboard with an optical switch, the illuminated keyboard comprising:
    a circuit board comprising plural light-emitting elements, plural light emitters and plural light receivers, wherein each light-emitting element emits a light beam, each light emitter emits a sensing light, and each light receiver generates an electronic signal when the sensing light from the corresponding light emitter is received by the light receiver; and
    plural keys located over the circuit board, wherein each key is aligned with the corresponding light-emitting element, the corresponding light emitter and the corresponding light receiver, and each key comprises:
        a keycap;
        a housing located under the keycap;
        a first reflective element disposed within the housing, wherein the sensing light is reflected by the first reflective element;
        a triggering post connected with the keycap and inserted into housing, wherein the triggering post is movable relative to the housing, and a second reflective element is connected with the triggering post, wherein after the sensing light from the first reflective element is received by the second reflective element, the sensing light is reflected to the light receiver by the second reflective element;
        a light guide element disposed within the housing and located over the light-emitting element; and
        a light guide frame disposed within the housing, wherein a top surface of the light guide frame is substantially at the same level with a top surface of the housing, and the light guide frame is connected with the light guide element and arranged around the triggering post,
        wherein after the light beam emitted by the light-emitting element is introduced into the housing, the light beam within the housing is guided to the light guide frame by the light guide element, and the light beam is scattered to a region around the triggering post and outputted from the keycap, wherein after the sensing light emitted by the light emitter is introduced into the housing and reflected to the second reflective element by the first reflective element, the sensing light is reflected to the light receiver by the second reflective element, so that the light receiver generates the electronic signal.

2. The illuminated keyboard according to claim 1, wherein an entrance runs through the top surface of the housing, and the triggering post is inserted into the housing through the entrance, wherein the light guide frame is arranged around the triggering post and accommodated within the entrance.

3. The illuminated keyboard according to claim 1, wherein the first reflective element is aligned with the light emitter, and the second reflective element is aligned with the light receiver.

4. The illuminated keyboard according to claim 1, wherein the second reflective element is connected with a bottom surface of the triggering post, and the second reflective element is moved with the triggering post.

5. The illuminated keyboard according to claim 1, wherein the housing comprises a first perforation and a second perforation, wherein the first perforation is aligned with the light emitter, and the sensing light is introduced into the housing through the first perforation, wherein the second perforation is aligned with the light receiver, and the sensing light is outputted from the housing through the second perforation.

6. The illuminated keyboard according to claim 5, wherein the housing further comprises a filter, and the filter is disposed on a bottom surface of the housing and aligned with the second perforation.

7. The illuminated keyboard according to claim 1, wherein the housing further comprises a light-inputting opening, and the light-inputting opening is aligned with the light guide element and located over the light-emitting element, wherein the light beam outside the housing is introduced into the light guide element through the light-inputting opening.

8. The illuminated keyboard according to claim 1, wherein the housing further comprises a reflective layer, and the reflective layer is formed on an inner wall of the housing for reflecting the light beam within the housing.

9. The illuminated keyboard according to claim 8, wherein a reflective space is defined between the light guide element and the reflective layer of the housing.

10. The illuminated keyboard according to claim 1, wherein the light guide frame and a top of the light guide element are integrated with each other.

11. The illuminated keyboard according to claim 1, wherein the light guide element is a light guide post.

12. The illuminated keyboard according to claim 1, wherein the light guide element is a light guide wall that is extended from a sidewall of the light guide frame toward the light-emitting element.

13. The illuminated keyboard according to claim 12, wherein the light guide wall has a light guide structure, and the light guide structure is formed on a surface of the light guide wall for guiding the light beam back to the light guide frame.

14. The illuminated keyboard according to claim 1, wherein the light guide element and the light guide frame are made of a light-guiding material.

15. An illuminated keyboard with an optical switch, the illuminated keyboard comprising:
a circuit board comprising plural light-emitting elements, plural light emitters and plural light receivers, wherein each light-emitting element emits a light beam, each light emitter emits a sensing light, and each light receiver generates an electronic signal when the sensing light from the corresponding light emitter is received by the light receiver; and
plural keys located over the circuit board, wherein each key is aligned with the corresponding light-emitting element, the corresponding light emitter and the corresponding light receiver, and each key comprises:
a keycap;
a housing located under the keycap;
a light guide element disposed within the housing and located over the light-emitting element;
a first reflective element disposed within the housing, wherein the sensing light is reflected by the first reflective element; and
a triggering post connected with the keycap and inserted into housing, wherein the triggering post is contacted with the light guide element, and a second reflective element is connected with the triggering post, wherein after the sensing light from the first reflective element is received by the second reflective element, the sensing light is reflected to the light receiver by the second reflective element, wherein the triggering post is made of a light-guiding material, and the triggering post is movable relative to the light guide element, wherein while the triggering post is moved, the triggering post is continuously contacted with the light guide element,
wherein after the light beam emitted by the light-emitting element is introduced into the housing, the light beam within the housing is guided to the triggering post by the light guide element, and the light beam is transmitted through the triggering post and outputted from the keycap, wherein after the sensing light emitted by the light emitter is introduced into the housing and reflected to the second reflective element by the first reflective element, the sensing light is reflected to the light receiver by the second reflective element, so that the light receiver generates the electronic signal.

16. The illuminated keyboard according to claim 15, wherein the first reflective element is aligned with the light emitter, and the second reflective element is aligned with the light receiver.

17. The illuminated keyboard according to claim 15, wherein the second reflective element is connected with a bottom surface of the triggering post, and the second reflective element is moved with the triggering post.

18. The illuminated keyboard according to claim 15, wherein the housing comprises a first perforation and a second perforation, wherein the first perforation is aligned with the light emitter, and the sensing light is introduced into the housing through the first perforation, wherein the second perforation is aligned with the light receiver, and the sensing light is outputted from the housing through the second perforation.

19. The illuminated keyboard according to claim 18, wherein the housing further comprises a filter, and the filter is disposed on a bottom surface of the housing and aligned with the second perforation.

20. The illuminated keyboard according to claim 15, wherein the housing comprises an entrance, and the triggering post comprises a first contact surface, wherein the triggering post is inserted into the housing through the entrance, and the first contact surface is contacted with the light guide element.

21. The illuminated keyboard according to claim 20, wherein the light guide element further comprises a second contact surface, wherein the first contact surface is contacted with the second contact surface and movable relative to the second contact surface.

22. The illuminated keyboard according to claim 21, wherein after the light beam is transferred to the second contact surface through the light guide element, the light beam is introduced into the triggering post through the second contact surface and the first contact surface.

23. The illuminated keyboard according to claim 21, wherein while the triggering post is moved, the first contact surface and second contact surface are continuously contacted with each other, so that the light beam is continuously introduced into the triggering post.

24. The illuminated keyboard according to claim 21, wherein the first contact surface and second contact surface are disposed within the housing.

25. The illuminated keyboard according to claim 15, wherein the housing further comprises a light-inputting opening, and the light-inputting opening is aligned with the light guide element and located over the light-emitting element, wherein the light beam outside the housing is introduced into the light guide element through the light-inputting opening.

26. The illuminated keyboard according to claim 15, wherein the housing further comprises a reflective layer, and the reflective layer is formed on an inner wall of the housing for reflecting the light beam within the housing.

27. The illuminated keyboard according to claim 26, wherein a reflective space is defined between the light guide element and the reflective layer of the housing.

* * * * *